(12) United States Patent
Chen et al.

(10) Patent No.: US 8,809,910 B1
(45) Date of Patent: Aug. 19, 2014

(54) THICK AlN INTER-LAYER FOR III-NITRIDE LAYER ON SILICON SUBSTRATE

(71) Applicant: Taiwan Semiconductor Manufacturing Co., Ltd., Hsin-Chu (TW)

(72) Inventors: Chi-Ming Chen, Zhubei (TW); Po-Chun Liu, Hsinchu (TW); Chung-Yi Yu, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/749,819

(22) Filed: Jan. 25, 2013

(51) Int. Cl.
*H01L 31/072* (2012.01)

(52) U.S. Cl.
USPC ............. 257/194; 257/76; 257/192; 257/195; 257/E29.084

(58) Field of Classification Search
USPC ....................... 257/76–77, 190–195
See application file for complete search history.

(56) References Cited

U.S. PATENT DOCUMENTS

| 8,013,320 | B2 * | 9/2011 | Matsuo et al. ................... 257/13 |
| 2008/0315255 | A1 | 12/2008 | Maa et al. |
| 2012/0168822 | A1 * | 7/2012 | Matsushita .................... 257/194 |
| 2012/0273795 | A1 * | 11/2012 | Li ..................................... 257/76 |
| 2012/0313145 | A1 * | 12/2012 | Makabe ........................ 257/194 |
| 2012/0326215 | A1 * | 12/2012 | Srivastava et al. ............ 257/288 |

OTHER PUBLICATIONS

Michael A. Briere, "GaN-Based Power Devices Offer Game-Changing Potential in Power-Conversion Electronics"; www.eetimes.com/general/printview/4010344, Dec. 18, 2013, p. 1-9.
Zang Keyan, et al.; "Strutural Analysis of Metalorganic Chemical Vapor Deposited A1N Nucleation Layers on Si (111)"; Department of Materials Science and Engineering MIT, Jan. 2004, 1-4.
Alex Lidow, PhD, et al.; "Gallium Nitride (GaN) Technology Overview", Efficient Power Conversion, www.epc-co.com, 2012, p. 1-6.

* cited by examiner

*Primary Examiner* — Dung A. Le
(74) *Attorney, Agent, or Firm* — Eschweiler & Associates, LLC

(57) ABSTRACT

The present disclosure relates to a gallium-nitride (GaN) transistor device having a composite gallium nitride layer with alternating layers of GaN and aluminum nitride (AlN). In some embodiments, the GaN transistor device has a first GaN layer disposed above a semiconductor substrate. An AlN inter-layer is disposed on the first GaN layer. A second GaN layer is disposed on the AlN inter-layer. The AlN inter-layer allows for the thickness of the GaN layer to be increased over continuous GaN layers, mitigating bowing and cracking of the GaN substrate, while improving the breakdown voltage of the disclosed GaN device.

20 Claims, 6 Drawing Sheets

THICK ALN INTER-LAYER FOR III-NITRIDE LAYER ON SILICON SUBSTRATE

BACKGROUND

Gallium nitride on silicon (GaN-on-Si) based devices have become an attractive option for power devices over the past few years. Gallium nitride transistor devices provide for a high electron mobility in a two-dimensional electron gas (2DEG) located near the interface of a AlGaN and a GaN heterostructure interface. The high electron mobility provides for a good power gain at high frequencies used in radio frequency (RF) applications.

DETAILED DESCRIPTION

Figure 1:
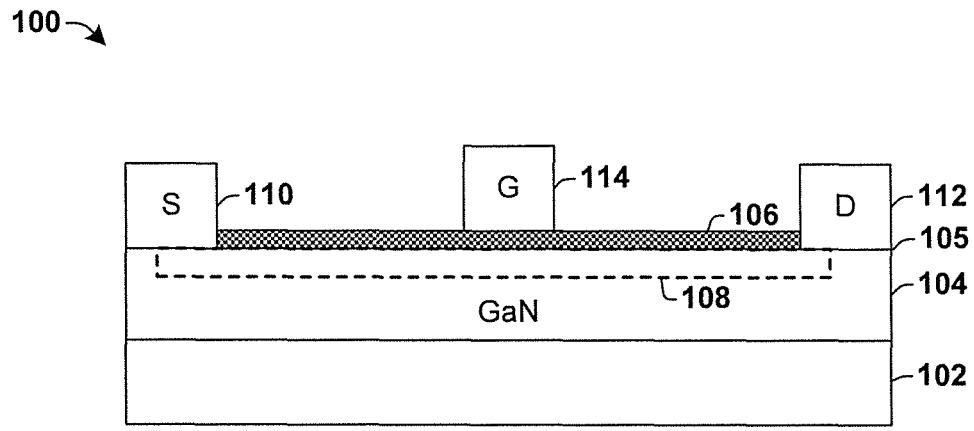
FIG. 1 illustrates a cross-sectional view of a conventional gallium nitride (GaN) transistor device.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It will be appreciated that the details of the figures are not intended to limit the disclosure, but rather are non-limiting embodiments. For example, it may be evident, however, to one of ordinary skill in the art, that one or more aspects described herein may be practiced with a lesser degree of these specific details. In other instances, known structures and devices are shown in block diagram form to facilitate understanding.

FIG. 1 illustrates a cross-sectional view of a conventional gallium nitride (GaN) transistor device 100. The GaN transistor device 100 comprises a semiconductor substrate 102. A gallium nitride (GaN) layer 104 is disposed above the semiconductor substrate 102. The GaN layer 104 abuts an overlying active layer 106 at an interface 105. Source region 110 and a drain region 112 are formed at opposing ends of the active layer 106. A two dimensional electron gas (2DEG) 108 forms along the interface 105. The 2DEG 108, comprising electrons having a high mobility, forms a channel between the source region 110 and the drain region 112. A gate region 114 is disposed above the active layer 106 at a position between the source region 110 and the drain region 112. When a voltage is applied to the gate region 114, a device current of the transistor device 100 is modulated.

The GaN layer 104 has a relatively high coefficient of thermal expansion (CTE) in comparison to the underlying semiconductor substrate 102. The large CTE difference between the GaN layer 104 and the underlying semiconductor substrate 102 may cause cracking and/or bowing of the substrate. It has been appreciated that by increasing the thickness of the GaN layer 104 bowing and cracking due to the CTE expansion can be mitigated, while improving device performance (e.g., device breakdown voltage).

Accordingly, the present disclosure relates to a gallium nitride (GaN) transistor device comprising a composite GaN layer having alternating layers of GaN and aluminum nitride (AlN). In some embodiments, the GaN device comprises a first GaN layer disposed above a semiconductor substrate. An AlN inter-layer is disposed on the first GaN layer. A second GaN layer is disposed on the AlN inter-layer. The AlN inter-layer allows for the thickness of the GaN layer to be increased over continuous GaN layers, mitigating bowing and cracking of the GaN substrate, while improving the breakdown voltage of the disclosed GaN device.

Figure 2:
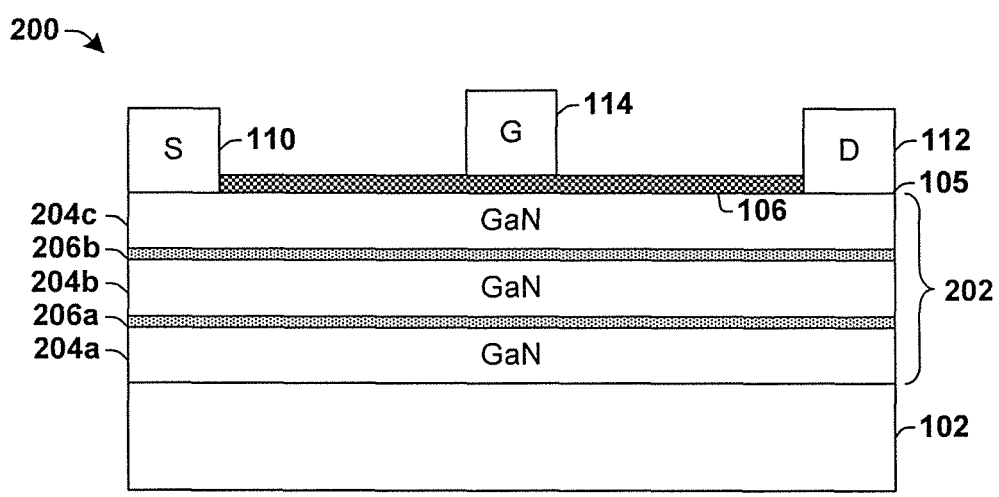
FIG. 2 illustrates a cross-sectional view of some embodiments of a disclosed gallium nitride transistor device.

FIG. 2 illustrates a cross-sectional view of some embodiments of a disclosed GaN transistor device 200. In various embodiments, the disclosed GaN transistor device 200 may comprise a High electron mobility transistor (HEMT) device, a metal-oxide-semiconductor field-effect transistor (MOSFET) device, or a metal-insulator-semiconductor field-effect transistor (MISFET) device, for example.

The GaN transistor device 200 comprises a semiconductor substrate 102. In some embodiments, the semiconductor substrate 102 may comprise a silicon substrate.

A composite gallium nitride (GaN) layer 202 is disposed above the semiconductor substrate 102. The composite GaN layer 202 comprises a plurality of GaN layers 204 interposed with aluminum nitride (AlN) inter-layers 206. For example, in some embodiments, the composite GaN layer 202 may comprise a first GaN layer 204a, a first AlN inter-layer 206a disposed on the first GaN layer 204a, a second GaN layer 204b disposed on the first AlN inter-layer 206a, a second AlN inter-layer 206b disposed on the second GaN layer 204b, and a third GaN layer 204c disposed on the second AlN inter-layer 206b.

In some embodiments, AlN inter-layers 206 having a thickness in a range of approximately 30 nm to approximately 80 nm is disposed between GaN layers 204 having a thickness in a range of between approximately 0.5 um and approximately 2 um. The composite GaN layer 202 may comprise a plurality of AlN inter-layers 206 (e.g., between 2 and 10) resulting in an overall thickness of the composite GaN layer 202 of greater than 5 um. The large thickness of the composite GaN layer 202 mitigates bowing and cracking of the GaN substrate, while improving breakdown voltage of the disclosed the GaN transistor device 200 to a voltage of greater than 600 V (e.g., a GaN transistor device having a 2.5 um thick composite GaN layer has a breakdown voltage of greater than 700 V).

In some embodiments, the AlN inter-layers 206 comprise a V/III ratio (e.g., a ratio of type V elements to type III elements) of between approximately 200 and approximately 2000. In some embodiments, the AlN inter-layers 206 may comprise doped AlN inter-layer. For example, in some embodiments, the AlN inter-layers 206 may comprise a carbon dopant with a doping concentration of greater than 1E17 atoms/cm$^3$. The doping of the AlN inter-layer 206 is proportional to the breakdown voltage of GaN transistor device 200, such that by increasing the doping concentration the breakdown voltage of GaN transistor device 200 can be increased.

Figure 3:
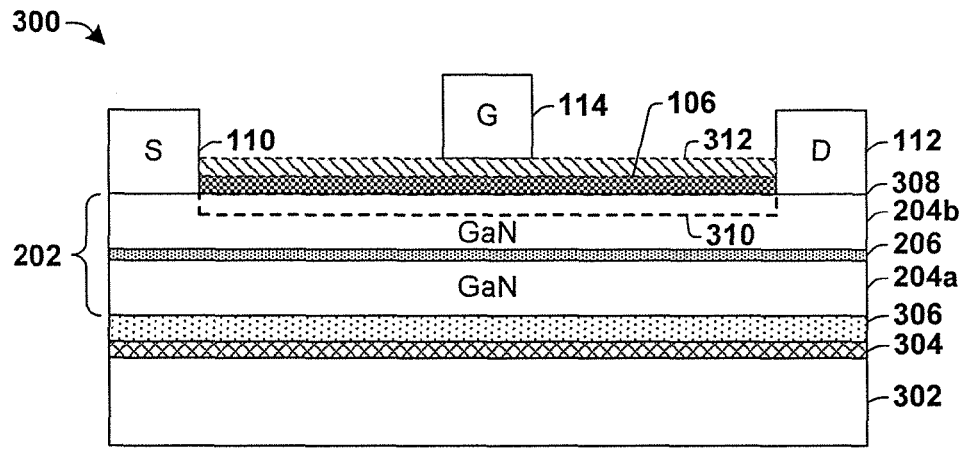
FIG. 3 illustrates a cross-sectional view of some alternative embodiments of a disclosed gallium nitride transistor device.

FIG. 3 illustrates a cross-sectional view of some alternative embodiments of a disclosed gallium nitride (GaN) transistor device 300.

The GaN transistor device 300 comprises a silicon substrate 302. The silicon substrate 302 may have a thickness of between approximately 625 um and approximately 1500 um. In some embodiments, the silicon substrate 302 has a <111> crystal orientation. In other embodiments, the silicon substrate 302 may have alternative crystal orientations.

A nucleation layer 304 is disposed above the silicon substrate 302. The nucleation layer 304 acts as a buffer layer that reduces strain between the silicon substrate 302 and overlying layers. In some embodiments, the nucleation layer 304 comprises an AlN nucleation layer. The silicon substrate 302 and the AlN nucleation layer have a smaller lattice mismatch and coefficient of thermal expansion than the silicon substrate 302 and gallium nitride, thereby allowing for a reduction in strain between the silicon substrate 302 and an overlying composite GaN layer 202. In some embodiments, the AlN nucleation layer may have a thickness in a range of between approximately 150 nm to approximately 300 nm.

A graded layer 306 is disposed above the nucleation layer 304. The graded layer 306 has a chemical formula that varies as a function of position. For example, the graded layer 306 has a first chemical formula at an interface between the graded layer 306 and the underlying nucleation layer 304, and a second chemical formula at an interface between the graded layer 306 and an overlying composite GaN layer 202.

In some embodiments, the graded layer 306 comprises an aluminum gallium nitride (AlGaN) layer disposed above an AlN nucleation layer. In various embodiments, the graded AlGaN layer may comprise a chemical formula of $Al_xGa_{1-x}N$, where x is in a range of approximately 0.1 to approximately 0.95 at different positions in the graded layer 306 (e.g., at a bottom of the graded layer the chemical formula is $Al_{0.75}Ga_{0.25}N$, in the middle $Al_{0.5}Ga_{0.5}N$, and at the top $Al_{0.25}Ga_{0.75}N$). In some embodiments, the graded AlGaN layer may have a thickness in a range of between approximately 150 nm to approximately 1200 nm.

A composite gallium nitride (GaN) layer 202 is disposed above the graded AlGaN layer 306. The composite GaN layer 202 comprises alternating gallium nitride (GaN) layers 204 and aluminum nitride (AlN) inter-layers 206. For example, a first GaN layer 204a is disposed above the graded AlGaN layer 306, an AlN inter-layer 206 is located on the first GaN layer 204a, a second GaN inter-layer 204b is disposed on the AlN inter-layer 206. In some embodiments, the composite GaN layer 202 comprises a plurality of AlN inter-layers 206 (e.g., 5, 10, etc.) disposed between GaN layers 204. In some embodiments, the AlN inter-layers 206 may be doped with a carbon dopant having a doping concentration of greater than approximately $1E17$ atoms/$cm^3$.

An active layer 106 is disposed above the composite GaN layer 202, such that the composite GaN layer 202 abuts the active layer 106 at an interface 308. In some embodiments, the active layer 106 is formed onto the composite GaN layer 202. In various embodiments, the active layer 106 may have a chemical formula of $Al_xGa_{1-x}N$, wherein x=0.1 to approximately 0.35. The active layer 106 may have a thickness in a range of between approximately 10 nm to approximately 30 nm. A two-dimensional electron gas (2DEG) 310 forms along an interface 308 between the active layer 106 and the composite GaN layer 202. The 2DEG 310, comprising electrons having a high mobility, forms a carrier channel located near the interface 308.

In some embodiments, an insulating layer 312 is disposed on the active layer 106. In various embodiments, the insulating layer 312 may comprise a silicon nitride (SiN) layer, an aluminum oxide (AlO3 or Al2O3) layer, a hafnium oxide layer (HfO2), or a silicon dioxide (SiO2) layer. Depending on the use and material used for the insulating layer, the disclosed GaN transistor device 300 operates differently. For example, when excluding the insulating layer 312, the disclosed GaN transistor device 300 operates as a high electron mobility transistor (HEMT) device. When using an insulating layer 312 such as Al2O3, HfO2, or SiN the disclosed GaN transistor device 300 operates as a MISFET. 312 such as SiO2 the disclosed GaN transistor device 300 operates as a MOSFET.

A source region 110 and a drain region 112 are located at opposing ends of an active layer 106. A gate region 114 is located above the active layer 106 between the source region 110 and the drain region 112. When a gate voltage is applied to the gate region 114, a device current of the GaN transistor device 300 is modulated within the 2DEG 310 located along interface 308. The 2DEG 310 comprises electrons having a high mobility.

Figure 4:
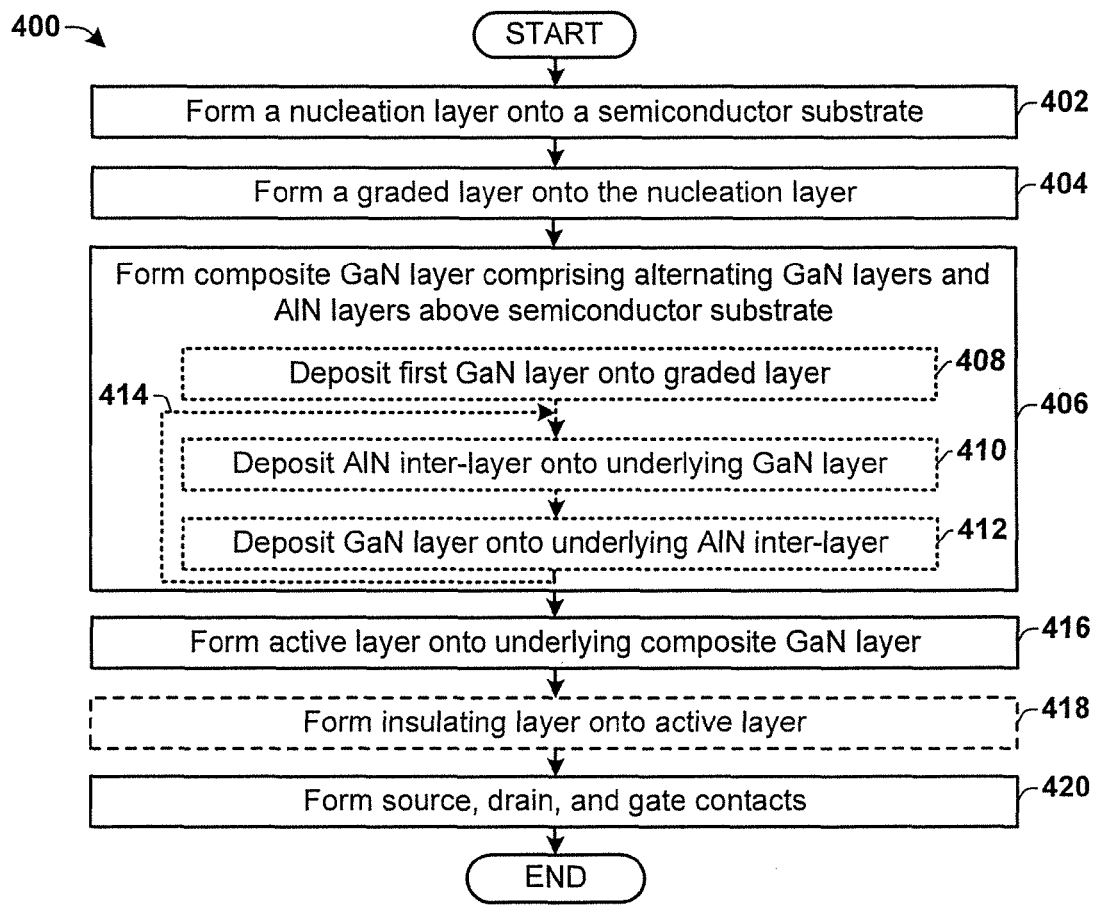
FIG. 4 is a flow diagram of some embodiments of a method of forming a disclosed gallium nitride transistor device.

FIG. 4 is a flow diagram of some embodiments of a method 400 for forming a gallium-nitride (GaN) transistor device.

At 402, a nucleation layer is formed onto a semiconductor substrate. In some embodiments, the nucleation layer comprises an aluminum nitride (AlN) nucleation layer.

At 404, a graded layer is formed onto the nucleation layer. In some embodiments, the graded layer comprises a graded aluminum gallium nitride (AlGaN) layer having a chemical formula of $Al_xGa_{1-x}N$, where x varies in a range of approximately 0.1 to approximately 0.95, as a function of position.

At 406, a composite gallium nitride (GaN) layer is formed onto the graded layer. The composite GaN layer comprises a plurality of alternating GaN layers and aluminum nitride (AlN) inter-layers.

In some embodiments, the composite gallium nitride (GaN) layer is deposited by first depositing a GaN layer onto the graded layer, at 408. At 410, an AlN inter-layer is deposited onto an underlying GaN layer. A subsequent GaN layer is deposited onto an underlying AlN inter-layer, at 412. In some embodiments, acts 410 and 412 may be iteratively performed (as illustrated by feedback line 414) to form a multiple AlN inter-layers interposed between GaN layers (e.g., a first AlN inter-layer disposed between a first and second GaN layer, a second AlN inter-layer disposed between the second and a third GaN layer, etc.).

At 416, an active layer is deposited onto the underlying composite GaN layer. In some embodiments, the active layer comprises an aluminum gallium nitride (AlGaN) layer having a chemical formula of $Al_xGa_{1-x}N$, where x is in a range of approximately 0.1 to approximately 0.35.

At 418, an insulating layer may be formed onto the active layer, in some embodiments.

At 420, a source region, a drain region, and a gate region are formed on the substrate. The source and drain regions are formed at opposite ends of the active layer and the gate region is formed above the active layer.

FIGS. 5-11B illustrate cross-sectional views of some embodiments of an integrated chip (IC) layout whereon method for forming a gallium nitride (GaN) transistor device is implemented.

Figure 5:
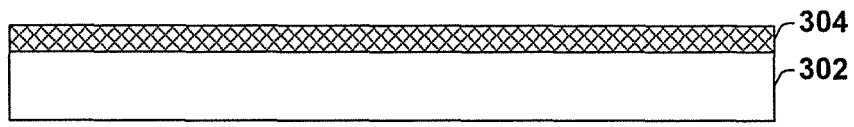
FIGS. 5-11B illustrate cross-sectional views of some embodiments of an integrated chip (IC) layout whereon method for forming a disclosed gallium nitride transistor device.

FIG. 5 illustrates some embodiments of a cross-sectional view 500 corresponding to act 402. As shown in cross-sectional view 500, a nucleation layer 304 is formed above a silicon substrate 302. In various embodiments, the silicon substrate 302 may comprise any type of semiconductor body such as a semiconductor wafer and/or one or more die on a wafer. In some embodiments, the semiconductor substrate may comprise a <111> silicon wafer having a thickness of between 625 um and 1500 um. In some embodiments, the nucleation layer 304 comprises an AlN nucleation layer formed by metal-organic chemical vapor deposition (MOCVD) to a thickness in a range of between approximately 150 nm and approximately 300 nm.

Figure 6:
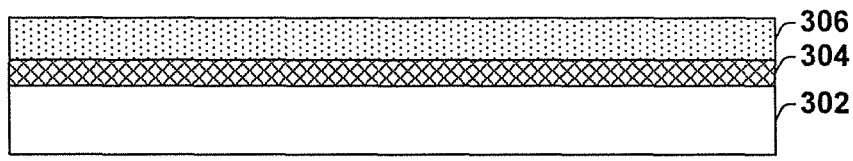

FIG. 6 illustrates some embodiments of a cross-sectional view 600 corresponding to act 404. As shown in cross-sectional view 700, a graded layer comprising an AlGaN graded layer 306 is formed onto an underlying nucleation layer 304. The AlGaN graded layer 306 may be formed onto the underlying nucleation layer 304 by metal-organic chemical vapor deposition (MOCVD) to a thickness in a range of between approximately 150 nm and approximately 1200 nm.

Figure 7:
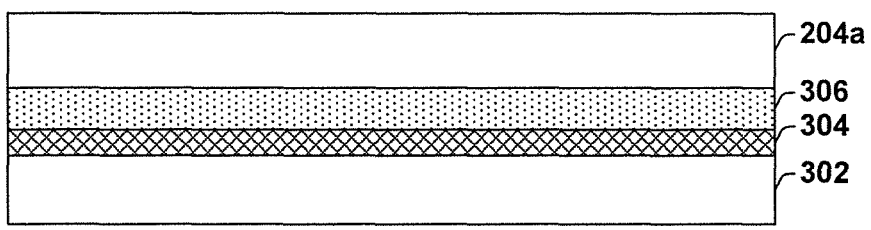

FIG. 7 illustrates some embodiments of a cross-sectional view 700 corresponding to act 408. As shown in cross-sectional view 700, a first gallium nitride (GaN) layer 204a is formed above the graded layer 306.

In some embodiments, the first GaN layer 204a may be grown by metal-organic chemical vapor deposition (MOCVD) process to a thickness in a range of between approximately 0.5 um and approximately 2 um. In some embodiments, the MOCVD process may be carried out in a processing chamber comprising source gases including a gallium based gas and a nitrogen based gas (e.g., NH3).

Figure 8:
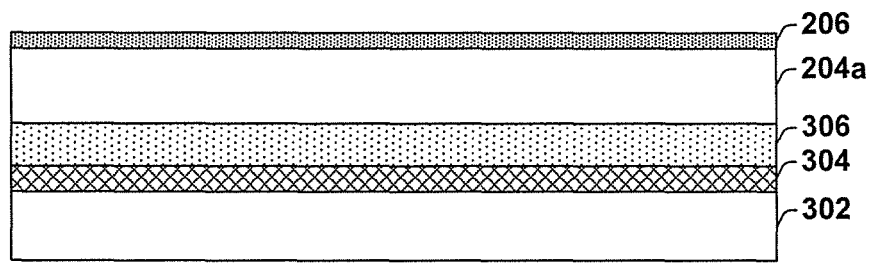

FIG. 8 illustrates some embodiments of a cross-sectional view 800 corresponding to act 410. As shown in cross-sectional view 800, an AlN inter-layer 206 is formed above the first GaN layer 204a. The AlN inter-layer 206 may be formed by metal-organic chemical vapor deposition (MOCVD) process to a thickness in a range of between approximately 30 nm and approximately 80 nm. In some embodiments, the AlN inter-layer 206 is formed by way of a MOCVD process carried out in a processing chamber at a temperature having a range of between approximately 900° C. and approximately 1100° C. and a pressure in a range of between approximately 20 and approximately 150 Torr. In some embodiments, the MOCVD process may be carried with a V/III ratio of between approximately 200 and approximately 2000. For example, the MOCVD process may be carried using a ratio of a NH3 (a type V material to provide N) to TMAl (a type III material to provide Al) of between 200 and 2000.

In some embodiments, additional source gases (e.g., carbon) may be introduced into the processing chamber to dope the AlN inter-layer 206. For example, in some embodiments, the AlN inter-layer 206 may be doped with a carbon doping having a concentration of greater than 1E17 atoms/cm$^3$.

Figure 9:
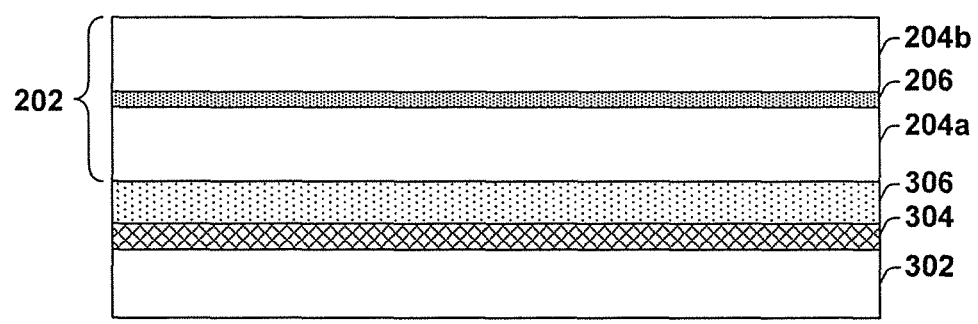

FIG. 9 illustrates some embodiments of a cross-sectional view 900 corresponding to act 412. As shown in cross-sectional view 900, a second GaN layer 204b is formed onto the underlying AlN inter-layer 206. The second GaN layer 204b may be formed by metal-organic chemical vapor deposition (MOCVD) process to a thickness in a range of between approximately 1 um and approximately 2 um.

Figure 10:
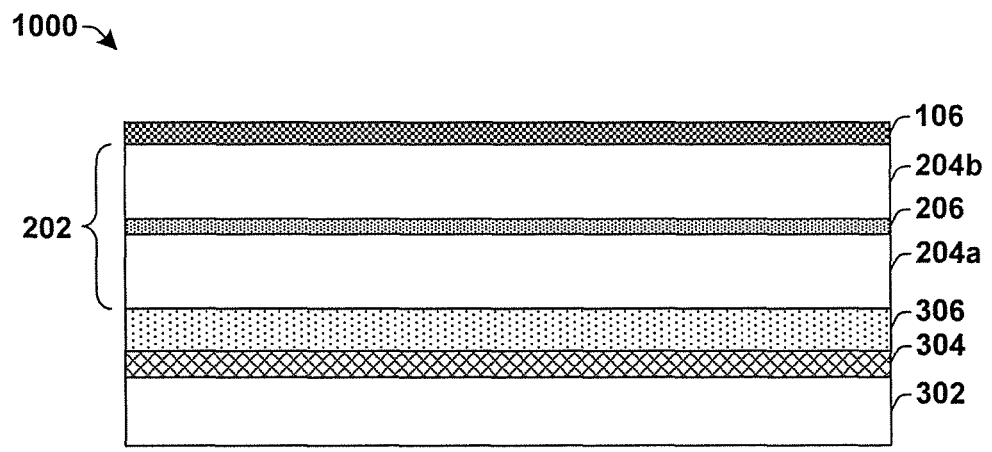

FIG. 10 illustrates some embodiments of a cross-sectional view 1000 corresponding to act 416. As shown in cross-sectional view 1000, an active layer 106 is formed above the composite GaN layer 202 (e.g., on second GaN layer 204b). The active layer 106 may comprise an $Al_xGa_{1-x}N$ layer (where x=0.1–0.35) deposited onto an underlying GaN layer by way of metal-organic chemical vapor deposition (MOCVD) process to a thickness in a range of between approximately 10 nm and approximately 30 nm.

Figure 11A:
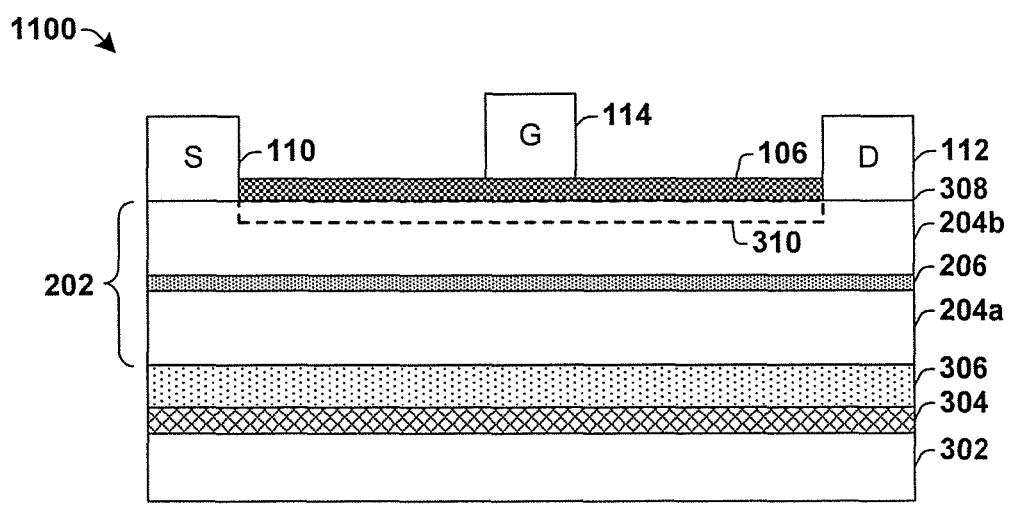

FIG. 11A illustrates some embodiments of a cross-sectional view 1100 corresponding to act 420. As shown in cross-sectional view 1100, a source region 110 and a drain region 112 are formed at opposing ends of the active layer 106. In some embodiments, the source region 110 and the drain region 112 are formed by selectively depositing a metal onto the substrate at a position in contact with the composite GaN layer 202 (e.g., with an uppermost GaN layer 204b) so as to form an ohmic contact with a two-dimensional electron gas (2DEG) 310 located at an interface 308 between the composite GaN layer 202 and the active layer 106. A gate region is formed onto the active layer 106 at a position between the source region 110 and the drain region 112. In some embodiments, the source region 110, the drain region 112, and the gate region 114 may be formed be depositing a tungsten material by way of a deposition process (e.g., PVD, CVD, etc.).

Figure 11B:
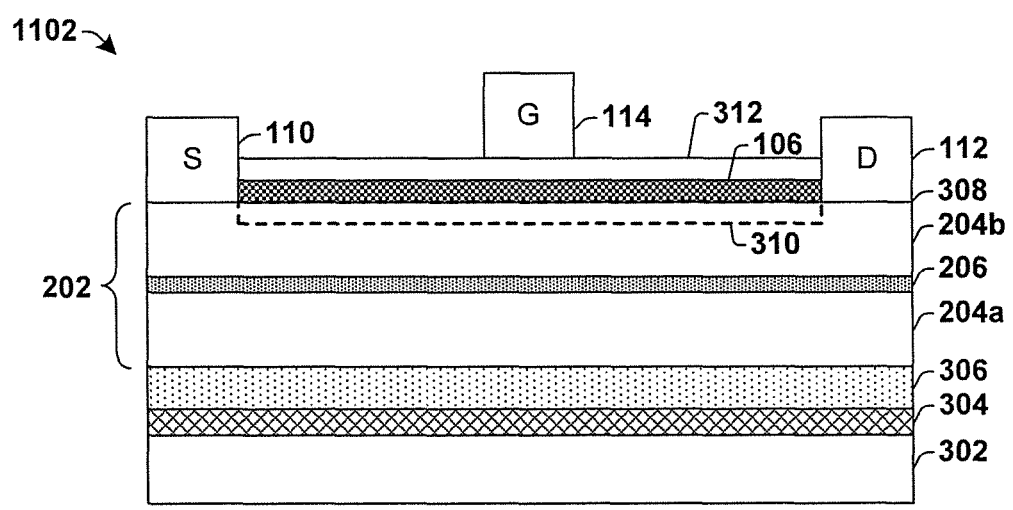

FIG. 11B illustrates some embodiments of a cross-sectional view 1102 corresponding to acts 418-420. As shown in cross-sectional view 1102, an insulating layer 312 is deposited above the active layer 106. In various embodiments, the insulating layer 312 may comprise a silicon nitride (SiN), an aluminum oxide (AlO3), a silicon dioxide (SiO2), or other appropriate insulating materials.

As shown in cross-sectional view 1102, a source region 110 and a drain region 112 are formed at opposing ends of the active layer 106 and the insulating layer 312. In some embodiments, the source region 110 and the drain region 112 are formed by selectively depositing a metal (e.g., tungsten), by way of a deposition process (e.g., PVD, CVD, etc.), onto the substrate at a position in contact with the composite GaN layer 202 (e.g., with an uppermost GaN layer 204b) so as to form an ohmic contact with a two-dimensional electron gas (2DEG) 310 located at an interface 308 between the composite GaN layer 202 and the active layer 106. A gate region is formed onto the active layer 106 at a position between the source region 110 and the drain region 112.

It will be appreciated that while reference is made throughout this document to exemplary structures in discussing aspects of methodologies described herein, those methodologies are not to be limited by the corresponding structures presented. Rather, the methodologies and structures are to be considered independent of one another and able to stand alone and be practiced without regard to any of the particular aspects depicted in the Figs. Additionally, layers described herein can be formed in any suitable manner, such as with spin on, sputtering, growth and/or deposition techniques, etc.

Also, equivalent alterations and/or modifications may occur to one of ordinary skill in the art based upon a reading and/or understanding of the specification and annexed drawings. The disclosure herein includes all such modifications and alterations and is generally not intended to be limited thereby. For example, although the figures provided herein are illustrated and described to have a particular doping type, it will be appreciated that alternative doping types may be utilized as will be appreciated by one of ordinary skill in the art.

In addition, while a particular feature or aspect may have been disclosed with respect to one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ from that illustrated herein.

Therefore, the present disclosure relates to a gallium nitride (GaN) transistor device comprising a composite gallium nitride (GaN) layer having alternating layers of GaN and AlN.

In some embodiments, the present disclosure relates to a gallium nitride (GaN) semiconductor device comprising a first gallium nitride (GaN) layer disposed above a semiconductor substrate. A first aluminum nitride (AlN) inter-layer is disposed onto the first GaN layer. A second gallium nitride (GaN) layer is disposed onto the aluminum inter-layer. An active layer is disposed above the second GaN layer. A source region is located at a first end of the active layer and a drain region is located at a second end of the active layer opposite the first end. A gate region is located above the active layer at a position between the source region and the drain region.

In other embodiments, the present disclosure relates to gallium nitride (GaN) semiconductor device. The GaN semiconductor device comprises an aluminum nitride (AlN) nucleation layer disposed on a silicon substrate. A graded aluminum gallium nitride (AlGaN) layer is disposed on the AlN nucleation layer. A first gallium nitride (GaN) layer is disposed on the graded AlGaN layer. An aluminum nitride (AlN) inter-layer is disposed on the first GaN layer. A second gallium nitride (GaN) layer is disposed on the aluminum inter-layer. An active layer is disposed above the second GaN layer.

In other embodiments, the present disclosure relates to a method of forming a gallium nitride semiconductor device. The method comprises forming a first gallium nitride (GaN) layer above a semiconductor substrate. The method further comprises forming an aluminum nitride (AlN) inter-layer onto the GaN layer. The method further comprises forming a second gallium nitride (GaN) layer onto the AlN inter-layer. The method further comprises forming an active layer above the second GaN layer.

What is claimed is:

1. A gallium nitride (GaN) semiconductor device, comprising:
   a first gallium nitride (GaN) layer disposed above a semiconductor substrate;
   a first aluminum nitride (AlN) inter-layer disposed onto the first GaN layer;
   a second gallium nitride (GaN) layer disposed onto the first AlN inter-layer;
   an active layer disposed onto the second GaN layer;
   a source region abutting a top surface of the second GaN layer and further abutting a first sidewall of the active layer;
   a drain region abutting the top surface of the second GaN layer and further abutting a second sidewall of the active layer opposite the first sidewall; and
   a gate region located above the active layer at a position between the source region and the drain region.

2. The GaN semiconductor device of claim 1, further comprising:
   an aluminum nitride (AlN) nucleation layer disposed between the semiconductor substrate and the first GaN layer.

3. The GaN semiconductor device of claim 2, further comprising:
   a graded aluminum gallium nitride (AlGaN) layer disposed between the AlN nucleation layer and the first GaN layer, wherein the graded AlGaN layer has an aluminum concentration that varies as a function of position.

4. The GaN semiconductor device of claim 3, wherein the graded AlGaN layer comprises a chemical formula of $Al_xGa_{1-x}N$, where x has a value that varies between a range of approximately 0.1 to approximately 0.95 at different positions in the graded AlGaN layer.

5. The GaN semiconductor device of claim 1, further comprising:
   a second aluminum nitride (AlN) inter-layer disposed onto the second gallium nitride (GaN) layer; and
   a third gallium nitride (GaN) layer disposed between the second AlN inter-layer and the active layer.

6. The GaN semiconductor device of claim 1,
   wherein the first GaN layer has a thickness in a range of approximately 0.5 um to approximately 2 um; and
   wherein the first AlN inter-layer has a thickness in a range of approximately 30 nm to approximately 80 nm.

7. The GaN semiconductor device of claim 6, further comprising:
   an insulating layer disposed between the active layer and the gate region.

8. The GaN semiconductor device of claim 1, wherein the active layer comprises a chemical formula of $Al_xGa_{1-x}N$, wherein x is in a range of between approximately 0.1 and approximately 0.35.

9. The GaN semiconductor device of claim 1, wherein the AlN inter-layer comprises a carbon doping concentration of greater than approximately 1E17 atoms/$cm^3$.

10. A gallium nitride (GaN) semiconductor device, comprising:
    an aluminum nitride (AlN) nucleation layer disposed on a silicon substrate;
    a graded aluminum gallium nitride (AlGaN) layer disposed on the AlN nucleation layer, wherein the graded AlGaN layer has an aluminum concentration that varies as a function of position;
    a first gallium nitride (GaN) layer disposed on the graded AlGaN layer;
    an aluminum nitride (AlN) inter-layer disposed on the first GaN layer;
    a second gallium nitride (GaN) layer disposed on the AlN inter-layer; and
    an active layer disposed above the second GaN layer, wherein a two-dimensional electron gas region is located along an interface between the active layer and the second GaN layer.

11. The GaN semiconductor device of claim 10, wherein the AlN inter-layer comprises a V/III ratio in a range of between approximately 200 and approximately 2000.

12. The GaN semiconductor device of claim 10, wherein the AlN inter-layer comprises a carbon doping concentration of greater than approximately 1E17 atoms/$cm^3$.

13. The GaN semiconductor device of claim 10, wherein the graded AlGaN layer comprises a chemical formula of $Al_xGa_{1-x}N$, where x has a value that varies between a range of approximately 0.1 to approximately 0.95 at different positions in the graded AlGaN layer.

14. The GaN semiconductor device of claim 10, further comprising:
    a source region abutting a first sidewall of the active layer; and
    a drain region abutting a second sidewall of the active layer opposite the first sidewall.

15. A gallium nitride (GaN) semiconductor device, comprising:
    a first plurality of gallium nitride (GaN) layers disposed above a semiconductor substrate;
    a second plurality of aluminum nitride (AlN) inter-layers disposed between adjacent GaN layers, wherein the second plurality of AlN inter-layers is smaller than the first plurality of GaN layers, and wherein a total thickness of the first plurality of GaN layers and the second plurality of AlN inter-layers is greater than approximately 5 um;
    an active layer disposed above the first plurality of GaN layers;
    an insulating layer disposed onto the active layer;
    a source region located at a first end of the active layer;

a drain region located at a second end of the active layer opposite the first end; and a gate region located onto the insulating layer at a position between the source region and the drain region.

16. The GaN semiconductor device of claim 15, further comprising:

an aluminum nitride (AlN) nucleation layer disposed over the semiconductor substrate and below the first plurality of GaN layers.

17. The GaN semiconductor device of claim 16, further comprising:

a graded aluminum gallium nitride (AlGaN) layer disposed onto the AlN nucleation layer, wherein the graded AlGaN layer has an aluminum concentration that varies as a function of position.

18. The GaN semiconductor device of claim 17, wherein the graded AlGaN layer comprises a chemical formula of $Al_xGa_{1-x}N$, where x is in a range of approximately 0.1 to approximately 0.95 at different positions in the graded AlGaN layer.

19. The GaN semiconductor device of claim 15, wherein respective GaN layers of the first plurality of GaN layers have a thickness in a range of between approximately 0.5 um and approximately 2 um; and wherein respective AlN inter-layers of the second plurality of AlN inter-layers have a thickness in a range of approximately 30 nm to approximately 80 nm.

20. The GaN semiconductor device of claim 15, wherein the second plurality of AlN inter-layers comprise between 3 and 10 AlN inter-layers.

* * * * *